(12) United States Patent
Yoshikawa et al.

(10) Patent No.: US 10,937,947 B2
(45) Date of Patent: Mar. 2, 2021

(54) MAGNETIC MEMORY DEVICE WITH A NONMAGNET BETWEEN TWO FERROMAGNETS OF A MAGNETORESISTIVE EFFECT ELEMENT

(71) Applicant: TOSHIBA MEMORY CORPORATION, Tokyo (JP)

(72) Inventors: Masatoshi Yoshikawa, Seongnam-si (KR); Tatsuya Kishi, Seongnam-si (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/564,123

(22) Filed: Sep. 9, 2019

(65) Prior Publication Data

US 2020/0303625 A1  Sep. 24, 2020

(30) Foreign Application Priority Data

Mar. 18, 2019  (JP) .............................. JP2019-050336

(51) Int. Cl.
*H01L 43/02* (2006.01)
*G11C 11/16* (2006.01)
*H01L 27/22* (2006.01)
*H01L 43/10* (2006.01)

(52) U.S. Cl.
CPC ............ *H01L 43/02* (2013.01); *G11C 11/161* (2013.01); *G11C 11/1659* (2013.01); *H01L 27/224* (2013.01); *H01L 43/10* (2013.01)

(58) Field of Classification Search
CPC ....... H01L 43/02; H01L 43/10; H01L 27/224; G11C 11/1659; G11C 11/161
See application file for complete search history.

(56) References Cited

U.S. PATENT DOCUMENTS

| 9,634,245 | B2 | 4/2017 | Gotti et al. |
| 10,026,465 | B2 | 7/2018 | Inokuchi et al. |
| 2017/0117027 | A1 | 4/2017 | Braganca et al. |
| 2019/0051820 | A1 | 2/2019 | Sugiyama et al. |
| 2019/0088854 | A1* | 3/2019 | Ito .......................... G11C 11/161 |

FOREIGN PATENT DOCUMENTS

| JP | 2017112359 A | 6/2017 |
| JP | 2018022544 A | 2/2018 |
| JP | 2018506181 A | 3/2018 |
| JP | 2019033166 A | 2/2019 |

* cited by examiner

*Primary Examiner* — Sultana Begum
(74) *Attorney, Agent, or Firm* — Holtz, Holtz & Volek PC

(57) ABSTRACT

According to one embodiment, a magnetic memory device includes a first interconnect and a magnetoresistive effect element. The first interconnect includes a first nonmagnet including a light metal and a second nonmagnet including a heavy metal on the first nonmagnet. The magnetoresistive effect element includes a third nonmagnet on the second nonmagnet, a first ferromagnet on the third nonmagnet, a second ferromagnet, and a fourth nonmagnet between the first ferromagnet and the second ferromagnet. The third nonmagnet has a film thickness of 2 nanometers or less.

16 Claims, 12 Drawing Sheets

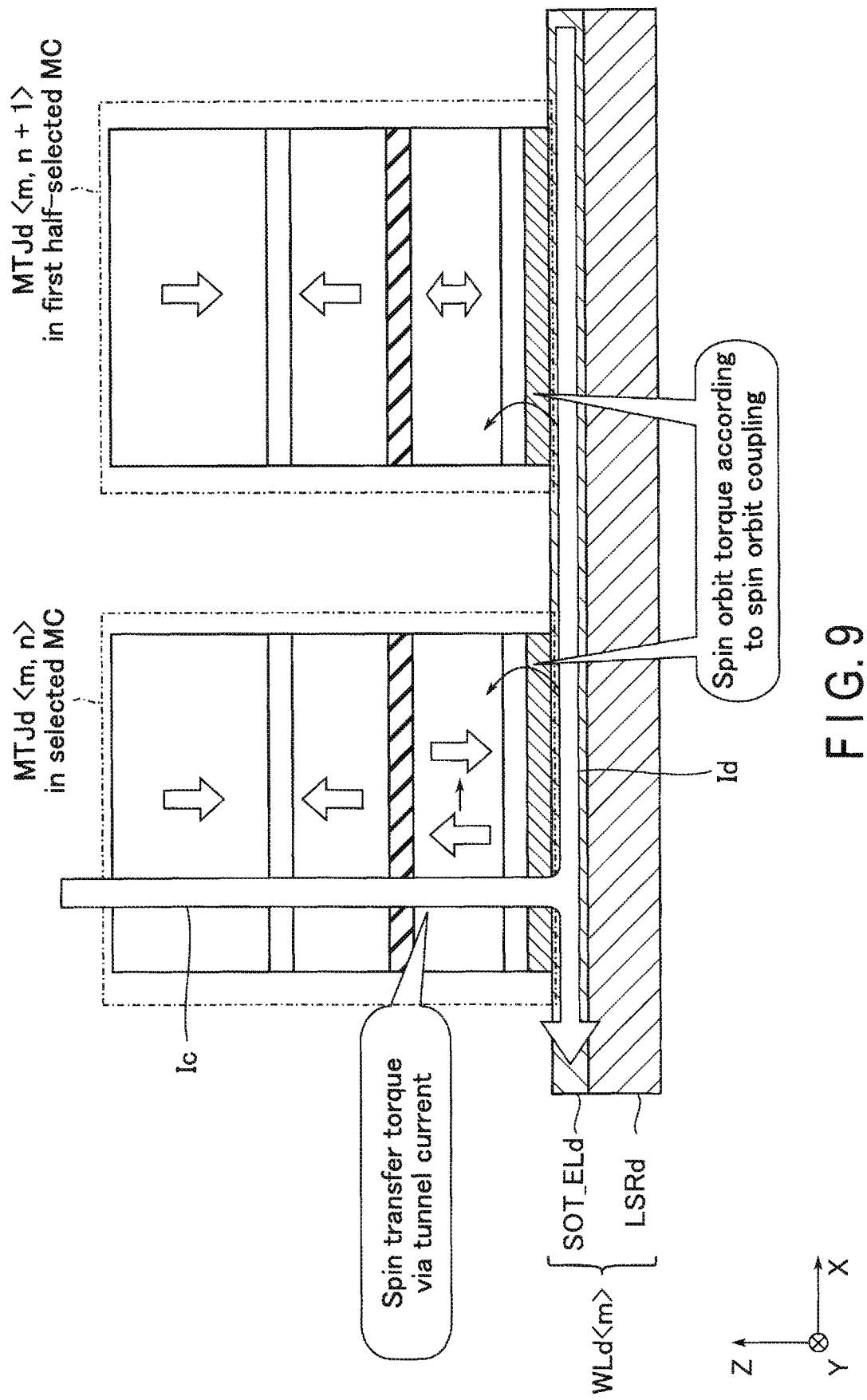
F I G. 9

MAGNETIC MEMORY DEVICE WITH A NONMAGNET BETWEEN TWO FERROMAGNETS OF A MAGNETORESISTIVE EFFECT ELEMENT

CROSS-REFERENCE TO RELATED APPLICATIONS

This application is based upon and claims the benefit of priority from Japanese Patent Application No. 2019-050336, filed Mar. 18, 2019, the entire contents of which are incorporated herein by reference.

FIELD

Embodiments described herein relate generally to a magnetic memory device.

BACKGROUND

A magnetic memory device (MRAM: Magnetoresistive Random Access Memory) using a magnetoresistive effect element as a storage element is known.

BRIEF DESCRIPTION OF THE DRAWINGS

FIG. 9 is a cross-sectional view to explain the write operation of the data "1" in the magnetic memory device according to the first embodiment.

DETAILED DESCRIPTION

In general, according to one embodiment, a magnetic memory device includes a first interconnect and a magnetoresistive effect element. The first interconnect includes a first nonmagnet including a light metal and a second nonmagnet including a heavy metal on the first nonmagnet. The magnetoresistive effect element includes a third nonmagnet on the second nonmagnet, a first ferromagnet on the third nonmagnet, a second ferromagnet, and a fourth nonmagnet between the first ferromagnet and the second ferromagnet. The third nonmagnet has a film thickness of 2 nanometers or less.

Hereinafter, the embodiments is described with reference to the drawings. In the description below, structural elements having the same functions and configurations is denoted by a common reference symbol. To distinguish a plurality of structural elements having a common reference symbol from each other, an additional symbol is added after the common reference symbol. If it is unnecessary to distinguish the structural elements, only a common reference symbol is assigned to the structural elements, and no additional symbol is added. Herein, additional symbols are not limited to subscripts or superscripts, and they may be lower-case alphabetical letters added to reference symbols, and indices meaning arrangements.

1. First Embodiment

A magnetic device according to a first embodiment is described. The magnetic device according to the first embodiment is, for example, a perpendicular magnetic magnetization-type magnetic memory device in which an element having a magnetoresistive effect provided by a magnetic tunnel junction (MTJ) (such an element may be called an MTJ element or a magnetoresistive effect element) as a resistance change element.

1.1 Configuration

First, a configuration of the magnetic memory device according to the first embodiment will be described.

1.1.1 Magnetic Memory Device

Figure 1:
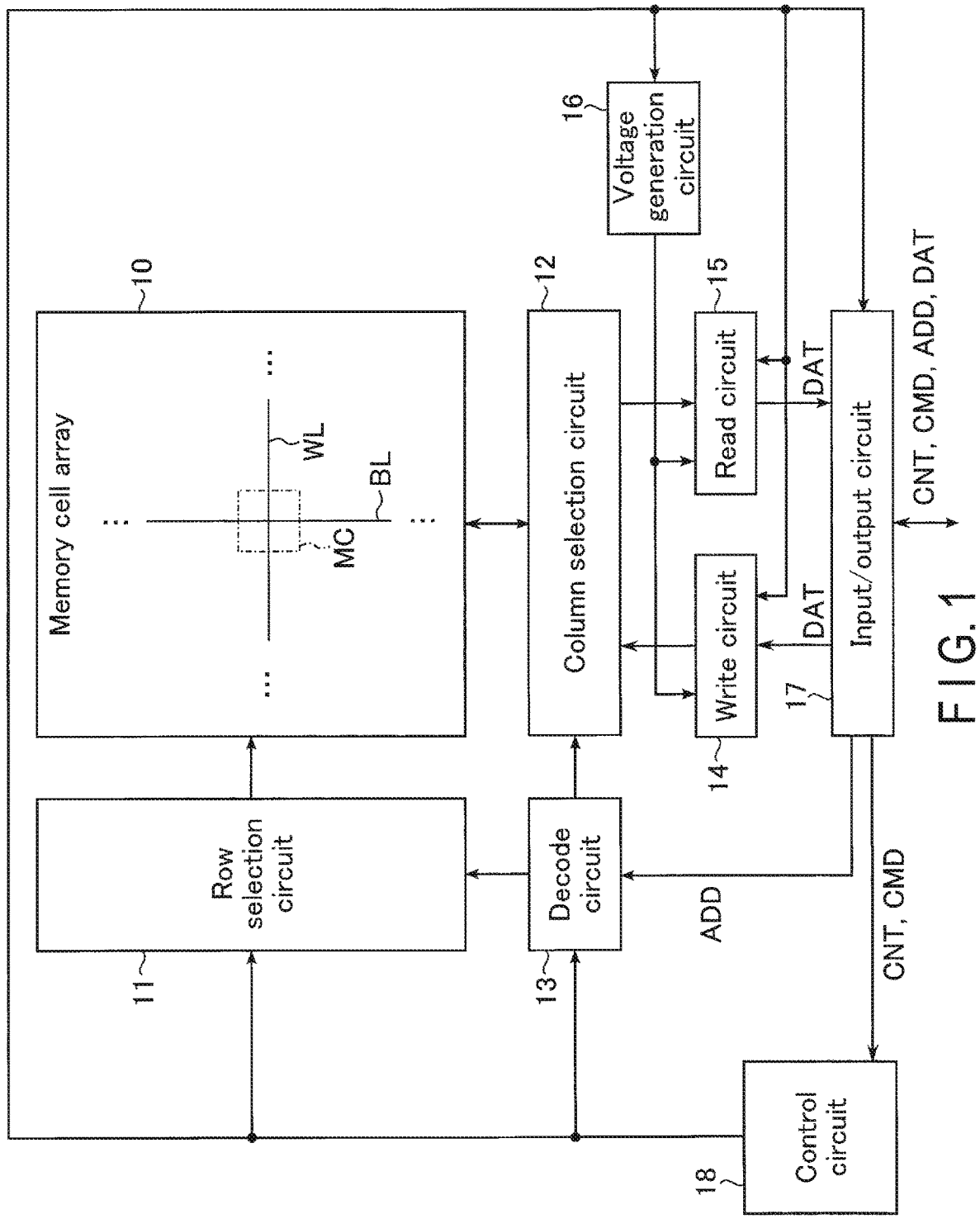
FIG. 1 is a block diagram to explain a configuration of a magnetic memory device according to a first embodiment.

FIG. 1 is a block diagram showing the configuration of the magnetic memory device according to the first embodiment. As shown in FIG. 1, the magnetic memory device 1 includes a memory cell array 10, a row selection circuit 11, a column selection circuit 12, a decode circuit 13, a write circuit 14, a read circuit 15, a voltage generation circuit 16, an input/output circuit 17, and a control circuit 18.

The memory cell array 10 includes a plurality of memory cells MC each associated with a set of row and column. Specifically, memory cells MC in the same row are coupled to the same word line WL, and memory cells MC in the same column are coupled to the same bit line BL.

The row selection circuit 11 is coupled to the memory cell array 10 via the word line WL, and the decode circuit 13 supplies a decoded result (row address) of an address ADD. The row selection circuit 11 is configured to independently apply different voltages to both ends of each of the word lines WL based on the decoded result. The row selection circuit 11 sets a word line WL, corresponding to a row based on the decoded result of the address ADD, in a selected state. Hereinafter, the word line WL set in the selected state is referred to as a selected word line WL. The word lines WL other than the selected word line WL are referred to as unselected word lines WL.

The column selection circuit 12 is coupled to the memory cell array 10 via the bit line BL, and the decode circuit 13 supplies the decoded result (column address) of the address ADD. The column selection circuit 12 is configured to independently apply different voltages to both ends of each of the bit lines BL based on the decoded result. The column selection circuit 12 sets a column based on the decoded result of the address ADD in the selected state. Hereinafter, the bit line BL set in the selected state is referred to as a selected bit line BL. The bit lines BL other than the selected bit line BL are referred to as unselected bit lines BL.

The decode circuit 13 decodes the address ADD from the input/output circuit 17. The decode circuit 13 supplies the decoded result of the address ADD to the row selection circuit 11 and the column selection circuit 12. The address ADD includes a column address and a row address to be selected.

The write circuit 14 writes data to the memory cell MC. The write circuit 14 includes, for example, a write driver (not shown).

The read circuit 15 reads data from the memory cell MC. The read circuit 15 includes, for example, a sense amplifier (not shown).

The voltage generation circuit 16 generates voltages for various operations of the memory cell array 10 using a power supply voltage provided from the outside (not shown) of the magnetic memory device 1. For example, the voltage generation circuit 16 generates various voltages necessary for write operation and outputs the generated voltages to the write circuit 14. Further, for example, the voltage generation circuit 16 generates various voltages necessary for read operation and outputs the generated voltages to the read circuit 15.

The input/output circuit 17 transfers the address ADD from the outside of the magnetic memory device 1 to the decode circuit 13. The input/output circuit 17 transfers a command CMD from the outside of the magnetic memory device 1 to the control circuit 18. The input/output circuit 17 transmits/receives various control signals CNT between the outside of the magnetic memory device 1 and the control circuit 18. The input/output circuit 17 transfers data DAT from the outside of the magnetic memory device 1 to the write circuit 14 and outputs the data DAT, transferred from the read circuit, 15 to the outside of the magnetic memory device 1.

The control circuit 18 controls operations of the row selection circuit 11, the column selection circuit 12, the decode circuit 13, the write circuit 14, the read circuit 15, the voltage generation circuit 16, and the input/output circuit 17 in the magnetic memory device 1 based on the control signal CNT and the command CMD.

1.1.2 Memory Cell Array

Figure 2:
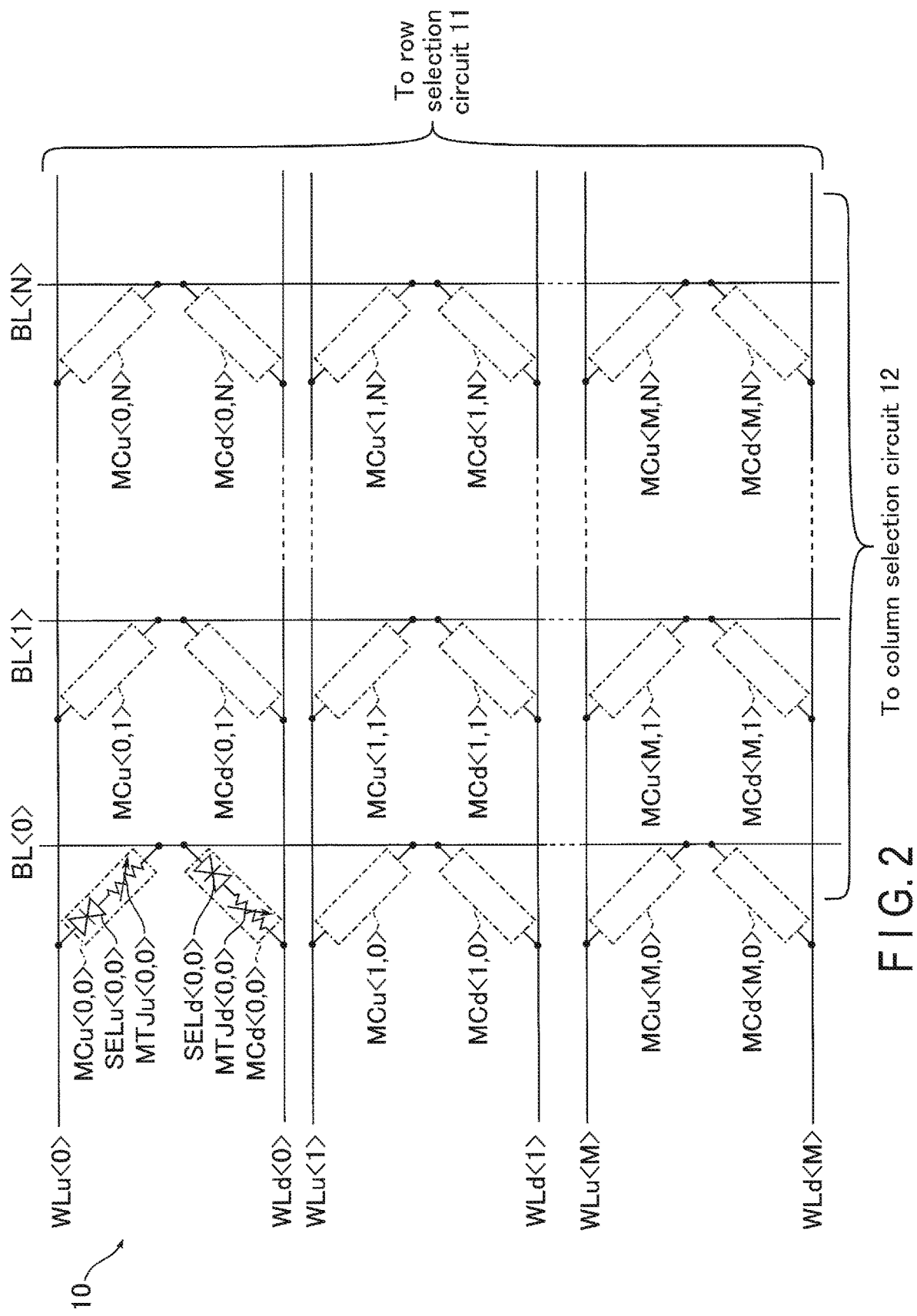
FIG. 2 is a circuit diagram to explain a configuration of a memory cell array of the magnetic memory device according to the first embodiment.

Next, the configuration of the memory cell array of the magnetic memory device according to the first embodiment is described with reference to FIG. 2. FIG. 2 is a circuit diagram showing the configuration of the memory cell array of the magnetic memory device according to the first embodiment. In FIG. 2, the word lines WL are shown to be classified by suffixes including two lower case alphabets ("u" and "d") and an index ("< >").

As shown in FIG. 2, the memory cells MC (MCu and MCd) are arranged in a matrix in the memory cell array 10 and associated with a pair of one of the bit lines BL (BL <0>, BL <1>, ..., and BL <N>) and one of word lines WLd (WLd <0>, WLd <1>, ..., and WLd <M>) and WLu (WLu <0>, WLu <1>, ..., and WLu <M>) (M and N are arbitrary integers). That is, a memory cell MCd <i, j> (0≤i≤M, 0≤j≤N) is coupled between a word line WLd <i> and a bit line BL <j>, and a memory cell MCu <i, j> is coupled between a word line WLu <i> and the bit line BL <j>.

The suffixes "d" and "u" respectively identify, for example, those disposed below and above the bit line BL for convenience. An example of a three-dimensional structure of the memory cell array 10 is described later.

The memory cell MCd <i, j> includes a selector SELd <i, j> and a magnetoresistive effect element MTJd <i, j> coupled in series. The memory cell MCu <i, j> includes a selector SELu <i, j> and a magnetoresistive effect element MTJu <i, j> coupled in series.

The selector SEL has a function as a switching element which controls supply of current to the magnetoresistive effect element MTJ during data writing to and reading from the corresponding magnetoresistive effect element MTJ. More specifically, for example, when voltage applied to the memory cell MC is less than a threshold voltage Vth, the selector SEL in a certain memory cell MC cuts off current as an insulator having a large resistance value (the selector SEL is in an off state), and when the voltage is more than the threshold voltage Vth, the selector SEL flows current as a conductor having a small resistance value (the selector SEL is in an on state). That is, the selector SEL has a function of switching whether to flow or cut off the current according to the magnitude of the voltage applied to the memory cell MC regardless of the direction of the flowing current.

The selector SEL may be, for example, a two-terminal type switching element having only two terminals. When the voltage applied between the two terminals is not more than a threshold, the switching element is in a "high resistance" state, for example, in an electrically non-conductive state. When the voltage applied between the two terminals is not less than the threshold, the switching element is changed to a "low resistance" state, for example, an electrically conductive state. The switching element may have this function even if the voltage is of either polarity. For example, the switching element may include at least one or more chalcogen element selected from a group consisting of tellurium (Te), selenium (Se) and sulfur (S). Alternatively, for example, the switching element may include a chalcogenide which is a compound containing the above chalcogen element. Besides, for example, the switching element may include at least one or more element selected from a group consisting of boron (B), aluminum (Al), gallium (Ga), indium (In), carbon (C), silicon (Si), germanium (Ge), tin (Sn), arsenic (As), phosphorus (P), and antimony (Sb).

The magnetoresistive effect element MTJ can switch the resistance value between the low resistance state and the high resistance state by the current whose supply is controlled by the selector SEL. The magnetoresistive effect element MTJ can write data by a change in its resistance state, holds the written data in a non-volatile manner, and functions as a readable memory element.

Figure 3:
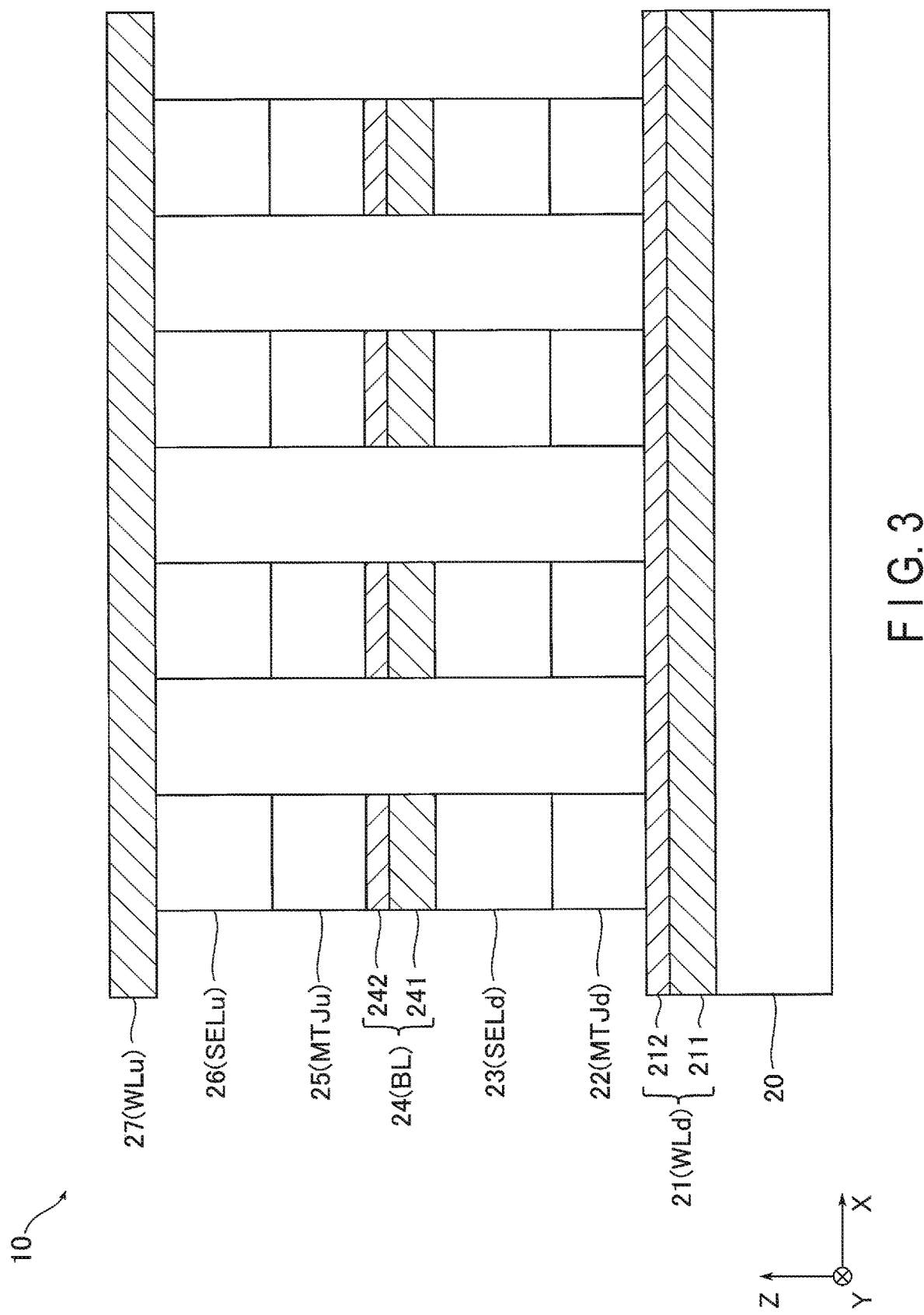
FIG. 3 is a cross-sectional view to explain a configuration of the memory cell array of the magnetic memory device according to the first embodiment.
Figure 4:
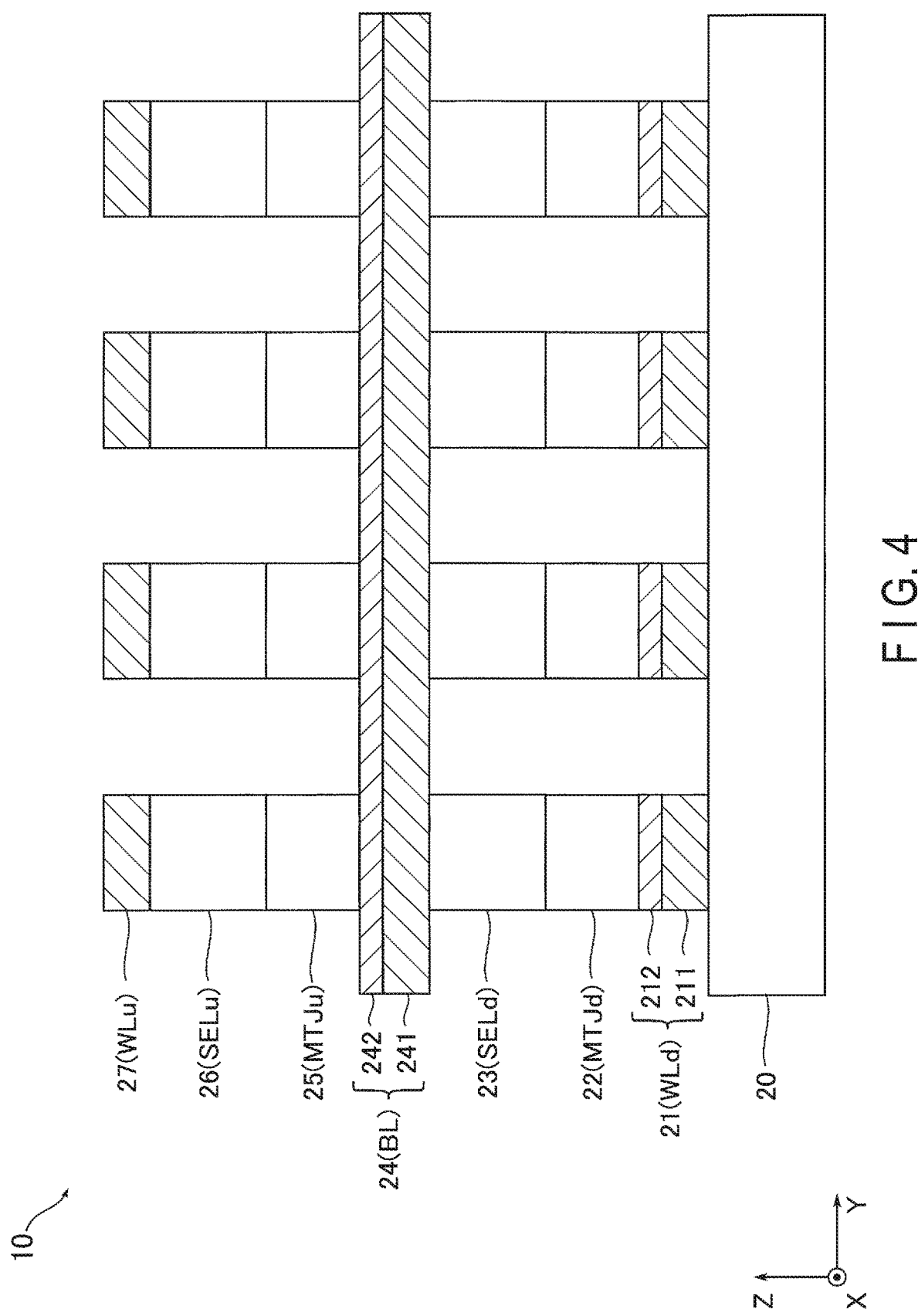
FIG. 4 is a cross-sectional view to explain a configuration of the memory cell array of the magnetic memory device according to the first embodiment.

Next, a cross-sectional structure of the memory cell array 10 is described with reference to FIGS. 3 and 4. FIGS. 3 and 4 show an example of a cross-sectional view for explaining the configuration of the memory cell array of the magnetic memory device according to the first embodiment. FIGS. 3 and 4 are cross-sectional views of the memory cell array 10 as viewed in different directions crossing each other.

As shown in FIGS. 3 and 4, the memory cell array 10 is disposed on a semiconductor substrate 20. In the following description, a plane parallel to a surface of the semiconductor substrate 20 is taken as an XY plane, and a direction perpendicular to the XY plane is taken as a Z direction. A direction along the word line WL is taken as an X direction, and a direction along the bit line BL is taken as a Y direction.

That is, FIGS. 3 and 4 are cross-sectional views of the memory cell array 10 as viewed in the Y direction and the X direction, respectively.

On the semiconductor substrate 20, a plurality of stacked conductors 21 each formed by stacking at least two layers of conductors are disposed. For example, in each of the stacked conductors 21, a conductive nonmagnet 211 and a conductive nonmagnet 212 are stacked in this order from the semiconductor substrate 20 side. For example, the stacked conductors 21 are arranged in the Y direction, and each extends in the X direction, and each functions as a word line WLd. Details of the stacked conductor 21 is described later.

Although FIGS. 3 and 4 describe a case where the stacked conductors 21 are disposed on the semiconductor substrate 20, the present invention is not limited to this case. For example, the stacked conductors 21 may be disposed above the semiconductor substrate 20 with a distance without being in contact with the semiconductor substrate 20.

A plurality of elements 22 each functioning as the magnetoresistive effect element MTJd are disposed on an upper surface of one stacked conductor 21. The elements 22 disposed on the upper surface of one stacked conductor 21 are arranged in the X direction, for example. That is, the elements 22 arranged in the X direction are coupled in common to the upper surface of the stacked conductor 21. Details of a configuration of the element 22 is described later.

An element 23 functioning as the selector SELd is disposed on the upper surface of each of the elements 22. An upper surface of each of the elements 23 is coupled to any one of stacked conductors 24. The stacked conductor 24 has, for example, a configuration equivalent to that of the stacked conductor 21. That is, in the stacked conductor 24, at least two layers of conductive nonmagnets 241 and 242 are stacked in this order from the semiconductor substrate 20 side. For example, the stacked conductors 24 are arranged in the X direction, each extends in the Y direction, and functions as the bit line BL. In other words, the elements 23 arranged in line along the Y direction are coupled to one stacked conductor 24 in common.

Although FIGS. 3 and 4 describe a case where the elements 23 are each disposed on the element 22 and the stacked conductor 24, the present invention is not limited to this case. For example, each of the elements 23 may be coupled to the element 22 and the stacked conductor 24 via a conductive contact plug (not shown).

A plurality of elements 25 each functioning as the magnetoresistive effect element MTJu are disposed on an upper surface of one stacked conductor 24. The elements 25 disposed on the upper surface of one stacked conductor 24 are arranged in the Y direction, for example. That is, the elements 25 arranged in the Y direction are coupled in common to the upper surface of one stacked conductor 24. The element 25 has, for example, a configuration equivalent to that of the element 22.

An element 26 functioning as the selector SELu is disposed on an upper surface of each of the elements 25. The element 26 has, for example, a functional configuration equivalent to that of the element 23. An upper surface of each of the elements 26 is coupled to any one of conductors 27. The conductors 27 have conductivity and function as the word lines WLu. For example, the conductors 27 are arranged in the Y direction and each extends in the X direction. That is, the elements 26 arranged in the X direction are coupled in common to one conductor 27.

Although FIGS. 3 and 4 describe a case where the elements 26 are each disposed on the element 25 and the conductor 27, the present invention is not limited to this case. For example, each of the elements 26 may be coupled to the element 25 and the conductor 27 via a conductive contact plug (not shown).

By being configured as described above, the memory cell array 10 has a structure in which a pair of two word lines WLd and WLu corresponds to one bit line BL. In the memory cell array 10, while the memory cell MCd is disposed between the word line WLd and the bit line BL, the memory cell MCu is disposed between the bit line BL and the word line WLu, and a plurality of layers disposed at different heights in the Z direction function as the memory cell array 10. In the structure shown in FIG. 3, the memory cell MCd is associated with a lower layer, and the memory cell MCu is associated with an upper layer. That is, among the two memory cells MC commonly coupled to one bit line BL, the memory cell MC disposed in an upper layer of the bit line BL corresponds to the memory cell MCu having the suffix "u", and the memory cell MC disposed in a lower layer corresponds to the memory cell MCd having the suffix "d".

1.1.3 Magnetoresistive Effect Element and Interconnects Close to Storage Layer

Figure 5:
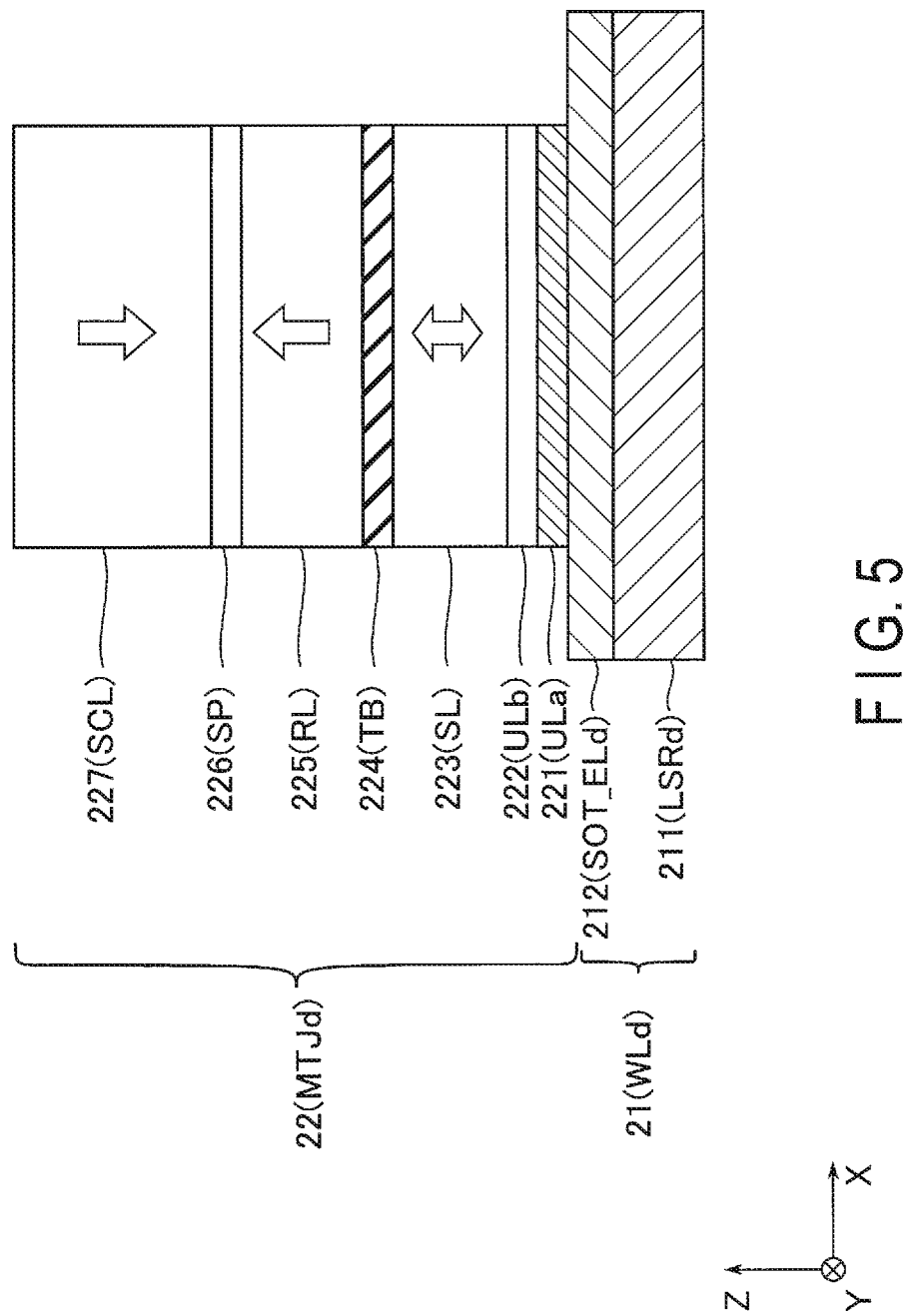
FIG. 5 is a cross-sectional view for to explain a configuration of a magnetoresistive effect element of the magnetic memory device and interconnect close to a storage layer according to the first embodiment.

Next, the magnetoresistive effect element of the magnetic memory device according to the first embodiment and a configuration example of interconnects close to the storage layer is described with reference to FIG. 5. FIG. 5 is a cross-sectional view showing the magnetoresistive effect element of the magnetic memory device according to the first embodiment and the configuration of interconnects close to the storage layer. FIG. 5 shows, for example, an example of a cross section obtained by cutting the element 22 and the stacked conductor 21 shown in FIG. 3 along a plane (for example, an XZ plane) perpendicular to the Z direction. The element 25 and the stacked conductor 24 have a configuration equivalent to that of the element 22 and the stacked conductor 21, and thus the description thereof is omitted.

As shown in FIG. 5, the stacked conductor 21 includes the nonmagnet 211, functioning as low resistance interconnect LSRd, and the nonmagnet 212 functioning as spin orbit torque (SOT) enhanced interconnect SOT_ELd. The element 22 includes a nonmagnet 221 functioning as an underlayer ULa, a nonmagnet 222 functioning as an underlayer ULb, a ferromagnet 223 functioning as a storage layer SL, a nonmagnet 224 functioning as a tunnel barrier layer TB, a ferromagnet 225 functioning as a reference layer RL, a nonmagnet 226 functioning as a spacer layer SP, and a ferromagnet 227 functioning as a shift cancelling layer SCL.

In the stacked conductor 21 and the element 22, for example, from the word line WLd side toward the bit line BL side (in a Z-axis direction), a plurality of materials are stacked in order of the nonmagnet 211, the nonmagnet 212, the nonmagnet 221, the nonmagnet 222, the ferromagnet 223, the nonmagnet 224, the ferromagnet 225, the nonmagnet 226, and the ferromagnet 227. The element 22 (and the element 25) functions as, for example, a perpendicular magnetization type MTJ element in which magnetization directions of magnets constituting the element 22 (and the element 25) face in directions perpendicular to film surfaces.

The nonmagnet 211 includes a low resistance material to suppress an increase in the resistance value of the entire stacked conductor 21. Specifically, the nonmagnet 211 includes, for example, a nonmagnetic light metal such as aluminum (Al) or copper (Cu).

The nonmagnet 212 includes at least one nonmagnetic heavy metal selected from 4d transition metals and 5d transition metals, and specific resistance of the nonmagnet 212 is larger than specific resistance of the nonmagnet 211. A film thickness of the nonmagnet 212 is designed to be, for example, smaller than a film thickness of the nonmagnet 211 in order to suppress an increase in interconnect resistance of the stacked conductor 21 as a whole. Examples of the 4d transition metals include yttrium (Y), zirconium (Zr), niobium (Nb), molybdenum (Mo), ruthenium (Ru), rhodium (Rh), palladium (Pd), and silver (Ag). Examples of the 5d transition metals include hafnium (Hf), tantalum (Ta), tungsten (W), osmium (Os), iridium (Ir), platinum (Pt), and gold (Au).

The nonmagnet 212 includes a metal element having large spin-orbit coupling strength, such as the 4d transition metal or the 5d transition metal, and thereby generates spin orbit coupling between spin of electrons flowing in the nonmagnet 212 and spin of electrons in the ferromagnet 223 close to the nonmagnet 212. Thereby, the nonmagnet 212 can inject spin orbit torque to the spins in the ferromagnet 223. When the nonmagnet 212 mainly includes at least one heavy metal selected from yttrium (Y), zirconium (Zr), niobium (Nb), molybdenum (Mo), hafnium (Hf), tantalum (Ta), and tungsten (W) (more preferably, hafnium (Hf), tantalum (Ta), and tungsten (W)) among the transition metals described above, a relatively large amount of spin orbit torque can be generated. On the other hand, when the nonmagnet 212 mainly includes at least one heavy metal selected from ruthenium (Ru), rhodium (Rh), palladium (Pd), silver (Ag), osmium (Os), iridium (Ir), platinum (Pt), and gold (Au) (more preferably, osmium (Os), iridium (Ir), platinum (Pt), and gold (Au)) among the transition metals described above, the specific resistance can be made relatively small.

The nonmagnet 221 includes at least one nonmagnetic heavy metal selected from 4d transition metals and 5d transition metals. Examples of the 4d transition metals include yttrium (Y), zirconium (Zr), niobium (Nb), molybdenum (Mo), ruthenium (Ru), rhodium (Rh), palladium (Pd), and silver (Ag). Examples of the 5d transition metals include hafnium (Hf), tantalum (Ta), tungsten (W), osmium (Os), iridium (Ir), platinum (Pt), and gold (Au). Similar to the nonmagnet 212, the nonmagnet 221 generates the spin orbit coupling between spin of electrons flowing in the nonmagnet 221 and the spin of the electrons in the ferromagnet 223 close to the nonmagnet 221. Thereby, the nonmagnet 221 can inject spin orbit torque to the spins in the ferromagnet 223.

The nonmagnet 222 is a nonmagnet disposed to be in contact with the ferromagnet 223 and includes an oxide, such as magnesium oxide (MgO), aluminum oxide ($Al_2O_x$), or magnesium-aluminum oxide (MgAlO), or a nitride. The nonmagnet 222 has, for example, a body-centered cubic crystal structure (a NaCl crystal structure in which a film surface is oriented in a (001) plane). In crystallization process of the ferromagnet 223 adjacent to the nonmagnet 222, the nonmagnet 222 can function as a seed material which becomes a nucleus for growing a crystalline film from an interface between the nonmagnet 222 and the ferromagnet 223.

The nonmagnet 222 is desirably disposed thin enough not to prevent the generation of the spin orbit coupling between the nonmagnet 212 (and the nonmagnet 221) and the ferromagnet 223, for example, to such an extent that the nonmagnet 212 (and the nonmagnet 221) and the ferromagnet 223 is nearer than a spin diffusion length. Specifically, the nonmagnet 222 is desirably designed to have a film thickness of 2 nanometers or less. More desirably, the nonmagnets 222 and 221 are desirably designed to have a total film thickness of 2 nanometers or less. For example, when the nonmagnet 222 includes magnesium oxide (MgO), the film thickness of the nonmagnet 222 is designed to be 1 nanometer or less.

The ferromagnet 223 has ferromagnetism and has a magnetization easy axis direction in a direction perpendicular to a film surface. The ferromagnet 223 has a magnetization direction toward any of the bit line BL side and the word line WL side. The ferromagnet 223 includes at least one of iron (Fe), cobalt (Co), and nickel (Ni). The ferromagnet 223 may further include boron (B). More specifically, for example, the ferromagnet 223 includes cobalt iron boron (CoFeB) or iron boride (FeB) and can have a body-centered cubic crystal structure.

The nonmagnet 224 is a nonmagnetic insulating film, contains, for example, magnesium oxide (MgO), and has, for example, a film thickness of 1 nanometer (nm) or less and an area resistance of 15 $\Omega cm^2$ or less. The nonmagnet 224 is disposed between the ferromagnet 223 and the ferromagnet 225 to form a magnetic tunnel junction with these two ferromagnets. The nonmagnet 224 has a body-centered cubic crystal structure (a NaCl crystal structure in which the film surface is oriented in the (001) plane). In crystallization process of the ferromagnets 223 and 225 adjacent to the nonmagnet 224, the nonmagnet 224 can function as a seed material which becomes a nucleus for growing a crystalline film from an interface between the nonmagnet 224 and the ferromagnet 223 and an interface between the nonmagnet 224 and the ferromagnet 225.

The ferromagnet 225 has ferromagnetism and has a magnetization easy axis direction in a direction perpendicular to a film surface. The ferromagnet 225 has a magnetization direction toward any of the bit line BL side and the word line WL side. The ferromagnet 225 includes, for example, at least one of iron (Fe), cobalt (Co), and nickel (Ni). The ferromagnet 225 may further include boron (B). More specifically, for example, the ferromagnet 225 includes cobalt iron boron (CoFeB) or iron boride (FeB) and can have a body-centered cubic crystal structure. The magnetization direction of the ferromagnet 225 is fixed, and in the example of FIG. 5, the magnetization direction of the ferromagnet 225 is directed to the direction of the ferromagnet 227. The expression "the magnetization direction is fixed" means that the magnetization direction does not change due to a current (or spin transfer torque generated by the current) of a magnitude that can reverse the magnetization direction of the ferromagnet 223 flowing in the magnetoresistive effect element MTJ.

Although not shown in FIG. 5, the ferromagnet 225 may be a laminate including a plurality of layers. Specifically, for example, the laminate constituting the ferromagnet 225 may have a structure in which in an interface layer including cobalt iron boron (CoFeB) or iron boride (FeB) described above, on the surface on the ferromagnet 227 side, a further ferromagnet is stacked via a nonmagnetic conductor. The nonmagnetic conductor in the stacked conductor constituting the ferromagnet 225 may include, for example, at least one metal selected from tantalum (Ta), hafnium (Hf), tungsten (W), zirconium (Zr), molybdenum (Mo), niobium (Nb), and titanium (Ti). The further ferromagnet in the stack constituting the ferromagnet 225 may include, for example, at least one multilayer film selected from a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The nonmagnet 226 is a nonmagnetic conductive film and includes, for example, ruthenium (Ru).

The ferromagnet 227 has ferromagnetism and has a magnetization easy axis direction in a direction perpendicular to a film surface. The ferromagnet 227 includes, for example, at least one alloy selected from cobalt platinum (CoPt), cobalt nickel (CoNi), and cobalt palladium (CoPd). Similar to the ferromagnet 227, the ferromagnet 227 may be a laminate including a plurality of layers. In that case, the ferromagnet 227 may include, for example, at least one multilayer film selected from a multilayer film of cobalt (Co) and platinum (Pt) (Co/Pt multilayer film), a multilayer film of cobalt (Co) and nickel (Ni) (Co/Ni multilayer film), and a multilayer film of cobalt (Co) and palladium (Pd) (Co/Pd multilayer film).

The ferromagnet 227 has a magnetization direction toward any of the bit line BL side and the word line WL side. The magnetization direction of the ferromagnet 227 is fixed, similar to the ferromagnet 225, and in the example of FIG. 5, the magnetization direction of the ferromagnet 227 is directed to the direction of the ferromagnet 225.

The ferromagnets 225 and 227 are antiferromagnetically coupled by the nonmagnet 226. That is, the ferromagnets 225 and 227 are coupled to have magnetization directions antiparallel to each other. For this reason, in the example of FIG. 5, the magnetization directions of the ferromagnets 225 and 227 are directed in directions opposite to each other. Such a coupled structure of the ferromagnet 225, the nonmagnet 226, and the ferromagnet 227 is referred to as a SAF (Synthetic Anti-Ferromagnetic) structure. Thereby, the ferromagnet 227 can offset an influence of a stray field of the ferromagnet 225 on the magnetization direction of the ferromagnet 223. Thus, it is possible to suppress that asymmetry is generated in the ease of reversal of magnetization of the ferromagnet 223 due to an external factor caused by the stray field of the ferromagnet 225 or the like (that is, it is possible to suppress that when the direction of the magnetization of the ferromagnet 223 is reversed, the ease of reversal is different between when the magnetization direction is reversed from one to the other and when the magnetization direction is reversed in the opposite direction).

In the first embodiment, in addition to the spin orbit torque described above, the spin transfer torque is injected into the storage layer SL by supplying a write current directly to the magnetoresistive effect element MTJ, and a magnetization direction of the storage layer SL with respect to a magnetization direction of the fixed reference layer RL is controlled. Thereby, the magnetoresistive effect element MTJ can change a relative relationship between the magnetization directions of the storage layer SL and the reference layer RL into a parallel or antiparallel state, and can take either a low resistance state or a high resistance state.

More specifically, when the relative relationship between the magnetization directions of the storage layer SL and the reference layer RL is in the parallel state, the resistance value of the magnetoresistive effect element MTJ is the lowest, and the magnetoresistive effect element MTJ is set to the low resistance state. This low resistance state is called a "P (Parallel) state" and defined as a data "0" state, for example.

When the relative relationship between the magnetization directions of the storage layer SL and the reference layer RL is in the antiparallel state, the resistance value of the magnetoresistive effect element MTJ is the highest, and the magnetoresistive effect element MTJ is set to the high resistance state. This high resistance state is called an "AP (Anti-Parallel) state" and defined as a data "1" state, for example.

Although the following description will be made according to the above-described data definition method, the method of defining the data "1" and the data "0" is not limited to the above-described example. For example, the P state may be defined as data "1", and the AP state may be defined as data "0".

1.2 Operation

Next, operation in the magnetic memory device according to the first embodiment is described.

1.2.1 Data "0" Write Operation

Figure 6:
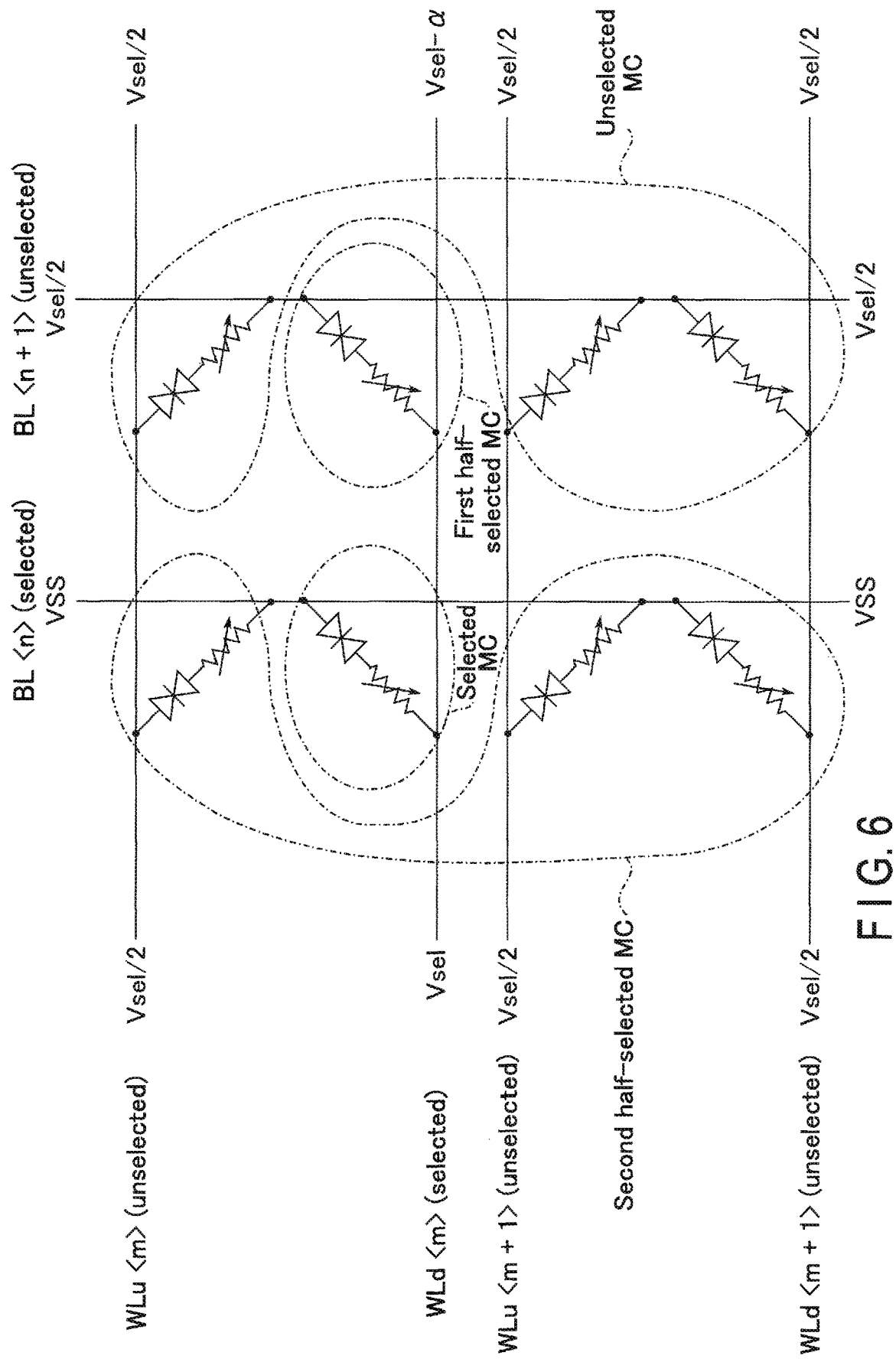
FIG. 6 is a circuit diagram to explain schematically a write operation of data "0" in the magnetic memory device according to the first embodiment.
Figure 7:
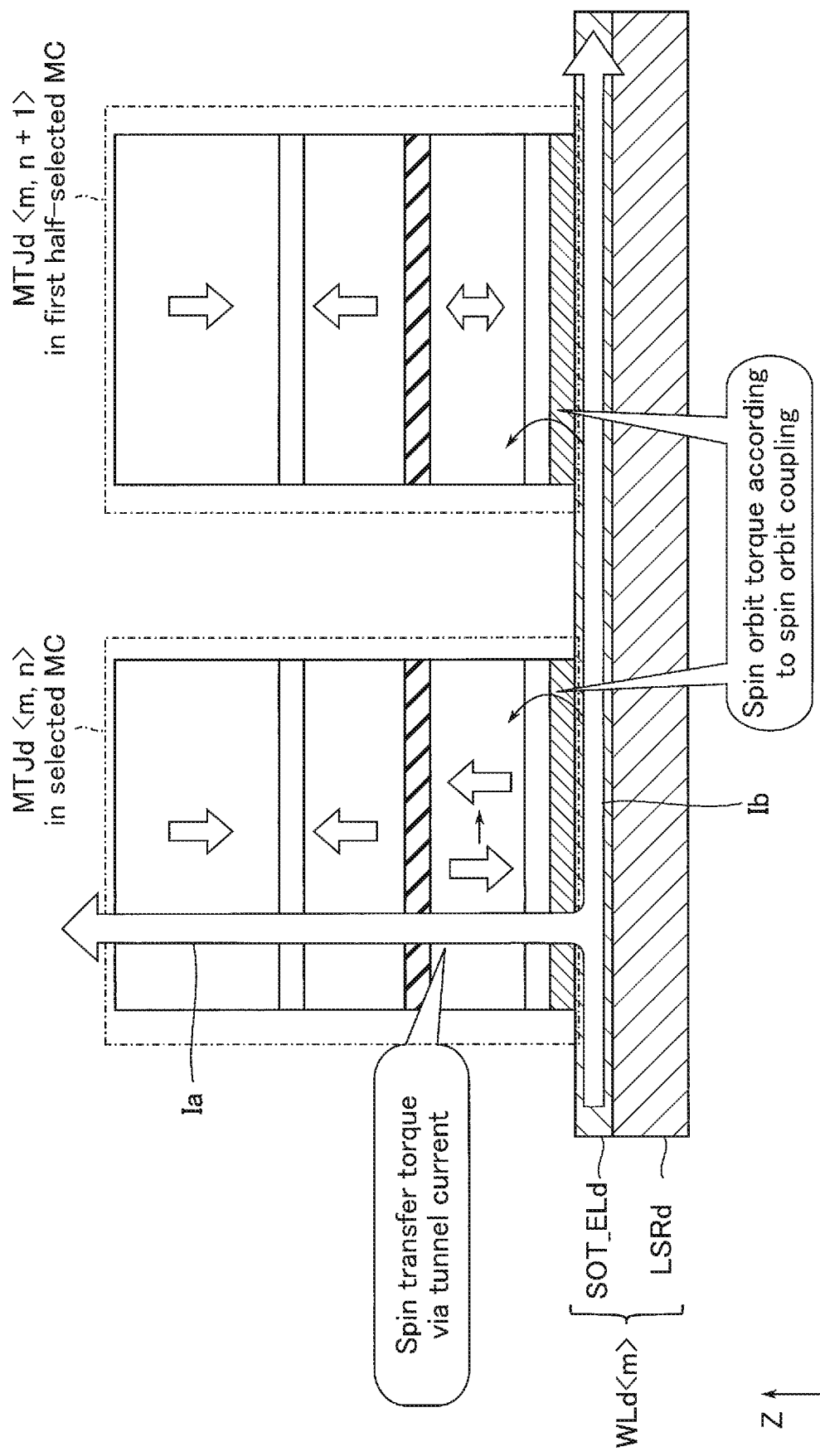
FIG. 7 is a cross-sectional view to explain schematically the write operation of the data "0" in the magnetic memory device according to the first embodiment.

FIGS. 6 and 7 are respectively a circuit diagram and a cross-sectional view for schematically explaining a data "0" write operation in the magnetic memory device according to the first embodiment. FIGS. 6 and 7 show a write operation (that is, the data "0" write operation) for changing the magnetoresistive effect element MTJd described in FIG. 5 from the high resistance state to the low resistance state.

First, a memory cell selecting operation is described with reference to FIG. 6.

FIG. 6 shows an example in which among eight memory cells MC coupled between bit lines BL $<n>$ and BL $<n+1>$ and between word lines WLu $<m>$, WLd $<m>$, WLu $<m+1>$, and WLd $<m+1>$, a memory cell MCd $<m, n>$ is selected.

As shown in FIG. 6, a row selection circuit 11 and a column selection circuit 12 perform control to apply a voltage Vsel between the selected word line WL and the selected bit line BL. The voltage Vsel is a voltage larger than the threshold voltage Vth of the selector SEL. The example of FIG. 6 shows, as an example, a case where the voltage Vsel is applied to the selected word line WLd $<m>$ and the voltage VSS is applied to the selected bit line BL $<n>$. The voltage VSS is a ground voltage and is 0V, for example. Thereby, a voltage higher than the threshold voltage Vth is applied to the selector SEL in the selected memory cell MC. Therefore, the selector SEL in the selected memory cell MC is turned on, and the write current can be supplied to the magnetoresistive effect element MTJ in the selected memory cell MC from the selected word line WLd $<m>$ toward the selected bit line BL $<n>$.

The row selection circuit 11 generates a potential difference at both ends of the selected word line WLd $<m>$. The example of FIG. 6 shows, as an example, a case where the row selection circuit 11 applies the voltage Vsel to a first end of the selected word line WLd $<m>$ and applies a voltage Vsel−α lower than the voltage Vsel to a second end of the selected word line WLd $<m>$ (α is a positive real number). Thereby, the row selection circuit 11 can supply current from the first end toward the second end of the selected word line WLd $<m>$ in addition to current flowing in the selected memory cell MCd $<m, n>$.

The row selection circuit 11 and the column selection circuit 12 perform control to supply a voltage Vsel/2 between unselected word line WL and unselected bit line BL. The voltage Vsel/2 is a voltage lower than the threshold voltage Vth. The example of FIG. 6 shows, as an example, a case where the voltage Vsel/2 is applied to the word lines WLu $<m>$, WLd $<m+1>$, and WLu $<m+1>$ and the bit line BL $<n+1>$.

The memory cell MC disposed between the selected bit line BL and the unselected word line WL and the memory cell MC disposed between the selected word line WL and the unselected bit line BL are referred to as half-selected memory cells MC (or memory cells MC in a half-selected state). A voltage less than the threshold voltage Vth is applied to the selector SEL in the half-selected memory cell MC. Thus, the selector SEL in the half-selected memory cell MC is turned off, and it is possible to suppress a flow of an unintended write current or read current to the magnetoresistive effect element MTJ in the half-selected memory cell MC.

The half-selected memory cell MC is classified into a first half-selected memory cell MC and a second half-selected memory cell MC. The first half-selected memory cell MC is in the half-selected state and is a memory cell MC (a memory cell MCd <m, n+1> in the example of FIG. 6) in which the spin orbit torque is injected into the storage layer SL. The second half-selected memory cell MC is in the half-selected state and is a memory cell MC (memory cells MCu <m, n>, MCd <m+1, n>, and MCu <m+1, n> in the example of FIG. 6) in which no spin orbit torque is injected into the storage layer SL. In the first embodiment, it is designed such that unintended data writing does not occur in the first half-selected memory cell MC due to only the spin orbit torque.

The memory cell MC disposed between the unselected bit line BL and the unselected word line WL is referred to as a unselected memory cell MC (or memory cell MC in a unselected state). In the example of FIG. 6, the unselected memory cells MC are memory cells MCu <m, n+1>, MCd <m+1, n+1>, and MCu <m+1, n+1>. Since the voltage Vsel/2 is applied to both the unselected bit line BL and the unselected word line WL, no voltage drop occurs in the unselected memory cell MC. Thus, the selector SEL in the unselected memory cell MC is turned off, and it is possible to suppress a flow of a write current or read current to the magnetoresistive effect element MTJ in the unselected memory cell MC. In the unselected memory cell MC, since no spin orbit torque is injected into the storage layer SL, a risk of unintended data writing is relatively low.

Next, the operation of spin torque injection into the memory cell MC is described with reference to FIG. 7.

As an example, FIG. 7 describes the spin torque injected into the selected memory cell MCd <m, n> and the first half-selected memory cell MCd <m, n+1>. FIG. 7 shows a case where the magnetization direction of the ferromagnet 223 is subjected to flux reversal from a state antiparallel to the magnetization direction of the ferromagnet 225 to a state parallel thereto.

As shown in FIG. 7, in the selected memory cell MCd <m, n>, when an internal selector SELd <m, n> is turned on, a current Ia flows from the selected word line WLd <m> toward the selected bit line BL <n> (from the ferromagnet 223 toward the ferromagnet 225). Electrons having passed through the ferromagnet 225 are spin-polarized in the magnetization direction in the ferromagnet 225. The electrons spin-polarized in the magnetization direction in the ferromagnet 225 inject the spin transfer torque in a direction in which the magnetization direction of the ferromagnet 223 is reversed in the magnetization direction of the ferromagnet 225.

In addition, in the selected word line WLd <m>, a current Ib flows from the first end toward the second end. As described above, since the nonmagnet 212 of the selected word line WLd <m> includes a heavy metal having a large spin-orbit coupling strength, spin of electrons flowing through the nonmagnet 212 causes spin orbit coupling with spin of electrons in the ferromagnet 223 close to the nonmagnet 212. Thus, the spin orbit torque is injected into each of the ferromagnets 223 in the selected memory cell MCd <m, n> and the first half-selected memory cell MCd <m, n+1>. The polarity of the spin orbit torque depends on the direction of the current Ib flowing in the selected word line WLd <m>. Thus, by suitably setting the direction of the current Ib (in the example of FIG. 7, the direction from the left side to the right side in the drawing), it is possible to inject the spin orbit torque in a direction in which the magnetization direction of the ferromagnet 223 is reversed in a direction parallel to the magnetization direction of the ferromagnet 225.

By operating as described above, in addition to the spin transfer torque, the spin orbit torque having the same polarity as this spin transfer torque can be injected into the ferromagnet 223 of the selected memory cell MCd <m, n>. Thereby, the magnetization direction of the ferromagnet 223 can be reversed in the direction parallel to the magnetization direction of the ferromagnet 225 by the sum of the two types of spin torques described above.

1.2.2 Data "1" Write Operation

Figure 8:
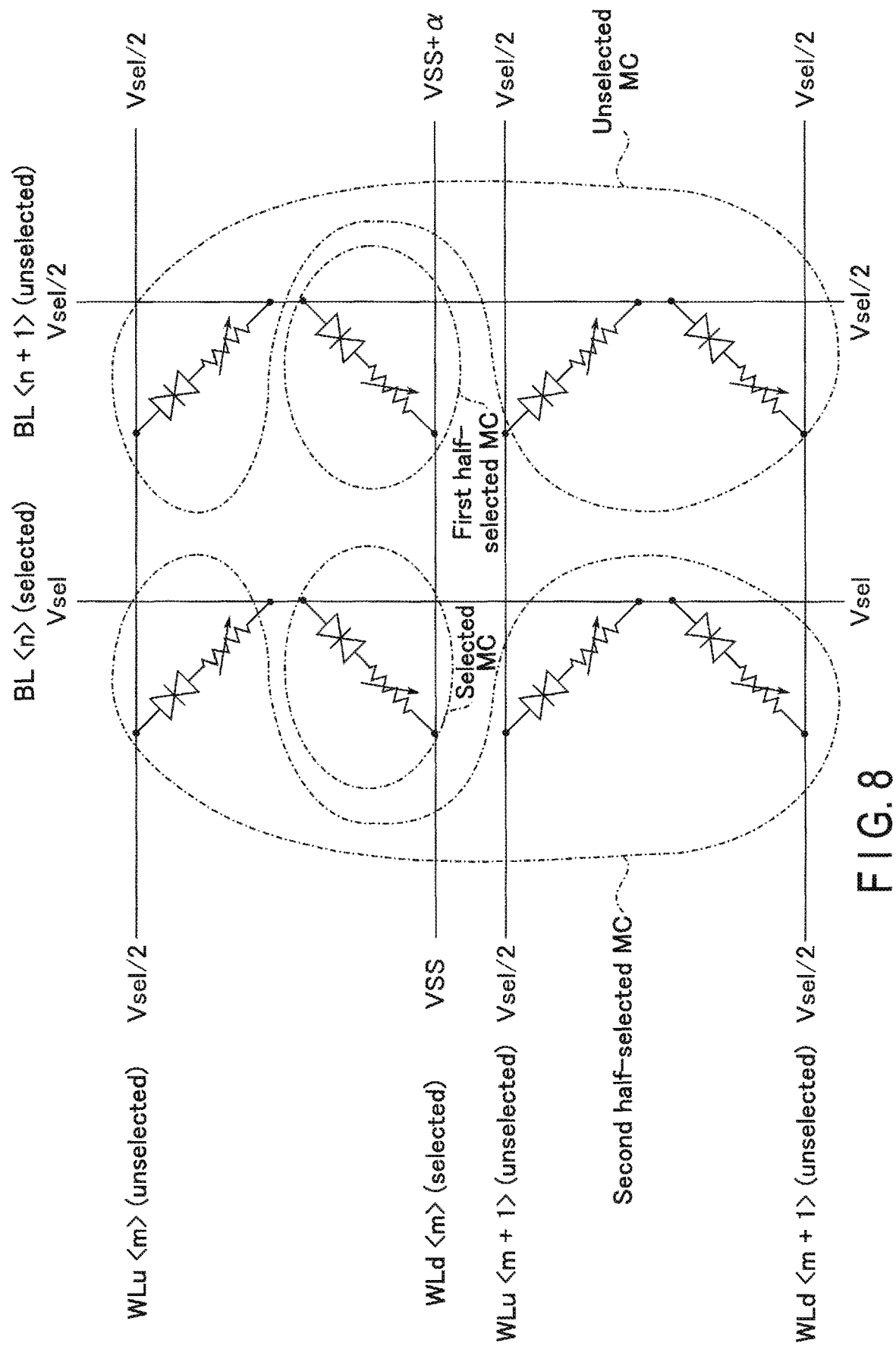
FIG. 8 is a circuit diagram to explain schematically a write operation of data "1" in the magnetic memory device according to the first embodiment.

FIGS. 8 and 9 are respectively a circuit diagram and a cross-sectional view for schematically explaining a data "1" write operation in the magnetic memory device according to the first embodiment and they correspond respectively to FIGS. 6 and 7. FIGS. 8 and 9 show a write operation (that is, the data "1" write operation) for changing the magnetoresistive effect element MTJd described in FIG. 5 from the low resistance state to the high resistance state.

First, a memory cell selecting operation is described with reference to FIG. 8.

As shown in FIG. 8, the row selection circuit 11 and the column selection circuit 12 perform control to apply the voltage Vsel between the selected word line WL and the selected bit line BL. The example of FIG. 8 shows, as an example, a case where the voltage VSS is applied to the selected word line WLd <m> and the voltage Vsel is applied to the selected bit line BL <n>. Thereby, a voltage higher than the threshold voltage Vth is applied to the selector SEL in the selected memory cell MC. Therefore, the selector SEL in the selected memory cell MC is turned on, and the write current can be supplied to the magnetoresistive effect element MTJ in the selected memory cell MC from the selected bit line BL <n> toward the selected word line WLd <m>.

The row selection circuit 11 generates a potential difference at both ends of the selected word line WLd <m>. The example of FIG. 8 shows, as an example, a case where the row selection circuit 11 applies the voltage VSS to the first end of the selected word line WLd <m> and applies a voltage VSS+α higher than the voltage VSS to the second end of the selected word line WLd <m>. Thereby, the row selection circuit 11 can supply current from the second end toward the first end of the selected word line WLd <m> in addition to current flowing in the selected memory cell MCd <m, n>.

The row selection circuit 11 and the column selection circuit 12 perform control to supply a voltage Vsel/2 between unselected word line WL and unselected bit line BL. The example of FIG. 8 shows, as an example, the case where the voltage Vsel/2 is applied to the word lines WLu <m>, WLd <m+1>, and WLu <m+1> and the bit line BL <n+1>.

A voltage less than the threshold voltage Vth is applied to the selector SEL in the half-selected memory cell MC. Thus, the selector SEL in the half-selected memory cell MC is turned off, and it is possible to suppress a flow of an unintended write current or read current to the magnetoresistive effect element MTJ in the half-selected memory cell MC. As with the case of FIG. 6, the memory cell MCd <m, n+1> of the half-selected memory cells MC becomes the first half-selected memory cell MC, and the memory cells MCu <m, n>, MCd <m+1, n>, and MCu <m+1, n> become the second half-selected memory cell MC.

No voltage drop occurs in the unselected memory cells MC. Thus, the selector SEL in the unselected memory cell MC is turned off, and it is possible to suppress a flow of a write current or read current to the magnetoresistive effect element MTJ in the unselected memory cell MC. In the unselected memory cell MC, since no spin orbit torque is injected into the storage layer SL, a risk of unintended data writing is relatively low.

Next, the injection operation of the spin torque into the memory cell MC is described with reference to FIG. 9. FIG. 9 shows a case where the magnetization direction of the ferromagnet 223 is subjected to flux reversal from the state parallel to the magnetization direction of the ferromagnet 225 to the state antiparallel thereto.

As shown in FIG. 9, in the selected memory cell MCd <m, n>, when the internal selector SELd <m, n> is turned on, a current Ic flows from the selected bit line BL <n> toward the selected word line WLd <m> (from the ferromagnet 225 toward the ferromagnet 223). As described above, electrons having passed through the ferromagnet 225 are spin-polarized in the magnetization direction in the ferromagnet 225. Thus, the electrons spin-polarized in a direction opposite to the magnetization direction in the ferromagnet 225 do not pass through the ferromagnet 225 but inject the spin transfer torque in a direction in which the magnetization direction of the ferromagnet 223 is reversed in the direction opposite to the magnetization direction of the ferromagnet 225.

In addition, in the selected word line WLd <m>, a current Id flows from the second end toward the first end. Thus, the spin orbit torque is injected into each of the ferromagnets 223 in the selected memory cell MCd <m, n> and the first half-selected memory cell MCd <m, n+1>. By setting the direction of the current Id to a direction opposite to the current Ib (in the example of FIG. 7, the direction from the right side to the left side in the drawing), it is possible to inject the spin orbit torque in a direction in which the magnetization direction of the ferromagnet 223 is reversed in a direction antiparallel to the magnetization direction of the ferromagnet 225.

By operating as described above, in addition to the spin transfer torque, the spin orbit torque having the same polarity as this spin transfer torque can be injected into the ferromagnet 223 of the selected memory cell MCd <m, n>. Thereby, the magnetization direction of the ferromagnet 223 can be reversed in the direction antiparallel to the magnetization direction of the ferromagnet 225 by the sum of the two types of spin torques described above.

1.3 Effects of Present Embodiment

According to the first embodiment, the stacked conductor 21 is formed by stacking the nonmagnet 211 including a light metal (such as copper (Cu) or aluminum (Al)) and the nonmagnet 212 including a heavy metal (such as the 4d transition metal or the 5d transition metal) in this order. The ferromagnet 223 in the magnetoresistive effect element MTJd close to the nonmagnet 212 within 2 nanometers. In the data "0" write operation to the magnetoresistive effect element MTJd <m, n>, the row selection circuit 11 supplies the current Ia, flowing from the selected word line WLd <m> to the selected bit line BL <n>, into the magnetoresistive effect element MTJd <m, n> and, at the same time, gives a potential difference to both ends of the selected word line WLd <m> to supply the current Ib in the selected word line WLd <m>. Thereby, while the spin transfer torque caused by the current Ia is injected into the ferromagnet 223, the spin orbit torque caused by the current Ib is injected into the ferromagnet 223. In the data "1" write operation to the magnetoresistive effect element MTJd <m, n>, the row selection circuit 11 supplies the current Ic, flowing from the selected bit line BL <n> to the selected word line WLd <m>, into the magnetoresistive effect element MTJd <m, n> and, at the same time, gives a potential difference to both ends of the selected word line WLd <m> to supply the current Id in a direction opposite to the current Ib into the selected word line WLd <m>. Thereby, in addition to the spin transfer torque, the spin orbit torque is injected into the ferromagnet 223. Thus, the magnitude of the current Ia or Ic can be smaller than the write current required when flux reversal is performed only with the spin transfer torque. In the spin orbit torque, the torque can be injected more efficiently than the spin transfer torque, it is possible to reduce a dispersion value of the spin torque injected during a predetermined write operation. Thus, in the write operation, it is possible to reduce the probability that an erroneous write occurs because a desired spin torque cannot be injected.

A nonmagnet 221 including a heavy metal is disposed between the nonmagnet 211 and the nonmagnet 222. Thereby, the spin orbit torque caused by the current Ib or Id can be injected into the ferromagnet 223 more efficiently.

A film thickness of the nonmagnet 212 is designed to be equal to or less than half a film thickness of the nonmagnet 211. Thereby, while it is possible to suppress an increase in the resistance value of the entire stacked conductor 21, it is possible to suppress a reduction in an amount of current flowing through the nonmagnet 212 relative to an amount of current flowing through the nonmagnet 211. For this reason, it is possible to generate a large amount of the spin orbit torque caused by the currents Ib and Id and contribute to a more efficient reduction of the currents Ia and Ic.

A nonmagnet 224 includes magnesium oxide (MgO) and has a film thickness of 1 nanometer or less. Thereby, current can flow in the magnetoresistive effect element MTJ, and the ferromagnet 223 can receive the spin transfer torque from a tunnel current flowing through the nonmagnet 224.

2. Second Embodiment

The first embodiment describes the case where the magnetoresistive effect element MTJ has a bottom free structure in which the ferromagnet 223 is disposed below the ferromagnet 225. In this case, flux reversal of the storage layer SL is assisted by generation of spin orbit coupling between the word line WLd and the memory cell MCd or between the bit line BL and the memory cell MCu, the present invention is not limited thereto. For example, the magnetoresistive effect element MTJ may have a top free structure in which the ferromagnet 223 is disposed above the ferromagnet 225. In this case, flux reversal of the storage layer SL is assisted by generation of spin orbit coupling between the bit line BL and the memory cell MCd or between the word line WLu and the memory cell MCu. In the following description, descriptions of configurations and manufacturing methods equivalent to those of the first embodiment is omitted, and configurations and manufacturing methods different from those of the first embodiment is mainly described.

2.1 Memory Cell Array

The configuration of a memory cell array of a magnetic memory device according to the second embodiment is described.

Figure 10:
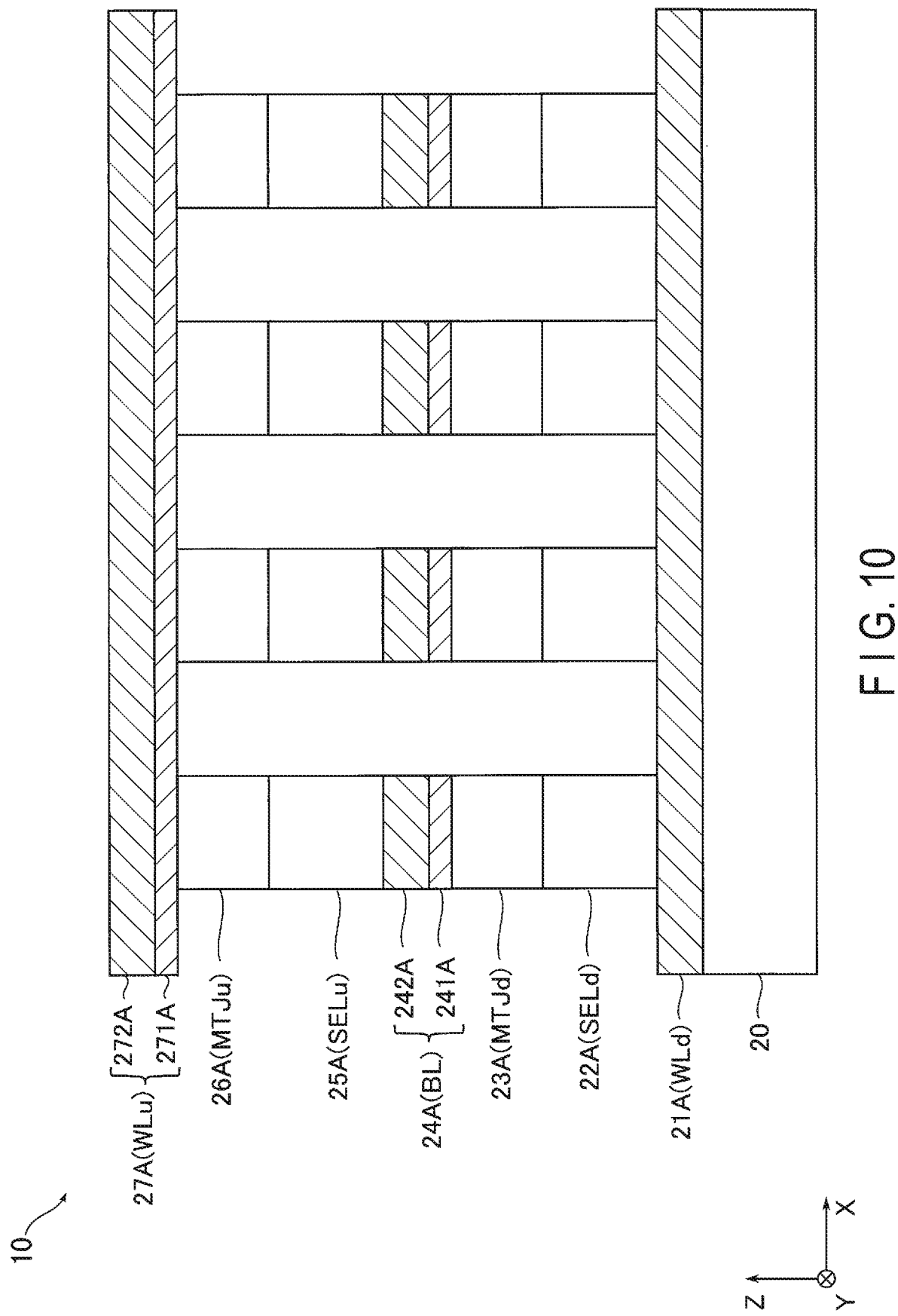
FIG. 10 is a cross-sectional view to explain a configuration of a memory cell array of a magnetic memory device according to a second embodiment.
Figure 11:
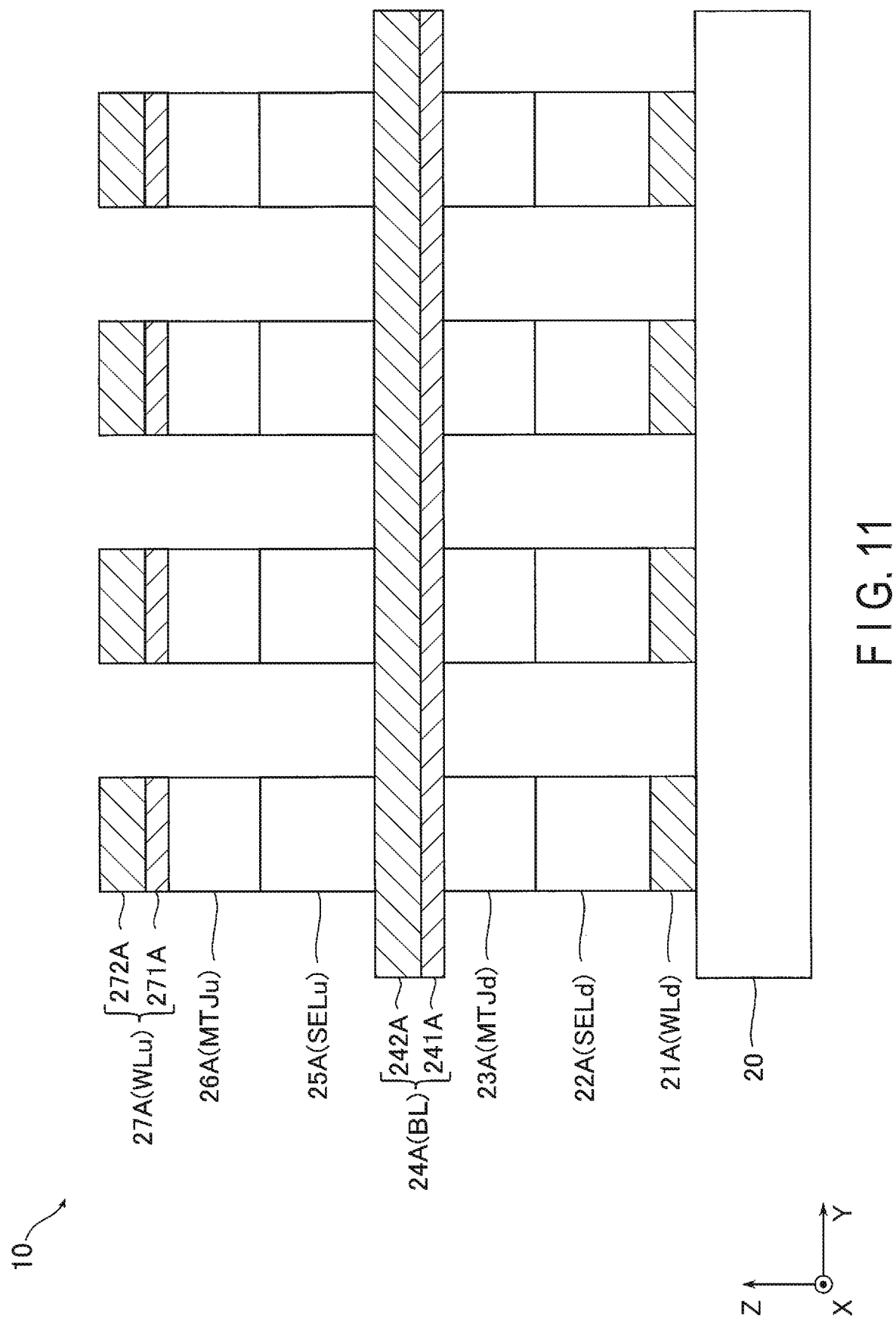
FIG. 11 is a cross-sectional view to explain the configuration of the memory cell array of the magnetic memory device according to the second embodiment.

FIGS. 10 and 11 show an example of a cross-sectional view for explaining the configuration of the memory cell array of the magnetic memory device according to the second embodiment. FIGS. 10 and 11 correspond to FIGS. 3 and 4 in the first embodiment, respectively.

As shown in FIGS. 10 and 11, a plurality of conductors 21A are disposed on a semiconductor substrate 20. For example, the conductors 21A are arranged in the Y direction, each extend along the X direction, and function as the word line WLd.

A plurality of elements 22A each functioning as a selector SELd are disposed on an upper surface of the conductor 21A. The elements 22A disposed on the upper surface of the conductor 21A are arranged in the X direction, for example. That is, the elements 22A arranged in the X direction are coupled in common to the upper surface of one conductor 21A.

An element 23A functioning as the magnetoresistive effect element MTJd is disposed on an upper surface of each of the elements 22A. An upper surface of each of the elements 23A is coupled to any one of stacked conductors 24A. In each of the stacked conductors 24A, at least two layers of conductive nonmagnets 241A and 242A are stacked in this order. For example, the stacked conductors 24A are arranged in the X direction, each extend along the Y direction, and function as the bit line BL. In other words, the elements 23 arranged in line along the Y direction are coupled to one stacked conductor 24A in common.

Although FIGS. 10 and 11 describe a case where the elements 22A are each disposed on the conductor 21A and the element 23A, the present invention is not limited to this case. For example, each of the elements 22A may be coupled to the conductor 21A and the element 23A via a conductive contact plug (not shown).

A plurality of elements 25A each functioning as a selector SELu are disposed on an upper surface of one stacked conductor 24A. The elements 25 disposed on the upper surface of one stacked conductor 24 are arranged in the Y direction, for example. That is, the elements 25A arranged in the Y direction are coupled in common to the upper surface of one stacked conductor 24A. The element 25A has, for example, a configuration equivalent to that of the element 22A.

An element 26A functioning as a magnetoresistive effect element MTJu is disposed on an upper surface of each of the elements 25A. The element 26A has, for example, a functional configuration equivalent to that of the element 23A. An upper surface of each of the elements 26A is coupled to any one of stacked conductors 27A. A plurality of conductors 27 each have, for example, a configuration equivalent to that of the stacked conductor 24A. That is, in the stacked conductor 27A, at least two layers of conductive nonmagnets 271A and 272A are stacked in this order from the semiconductor substrate 20 side. For example, the stacked conductors 27A are arranged in the Y direction, each extend along the X direction, and function as the word line WLu. That is, the elements 26A arranged in the X direction are coupled in common to the stacked conductor 27A.

Although FIGS. 10 and 11 describe a case where the elements 25A are each disposed on the stacked conductor 24A and the element 26A, the present invention is not limited to this case. For example, each of the elements 25A may be coupled to the stacked conductor 24A and the element 26A via a conductive contact plug (not shown).

2.2 Magnetoresistive Effect Element and Interconnects Close to Storage Layer

Figure 12:
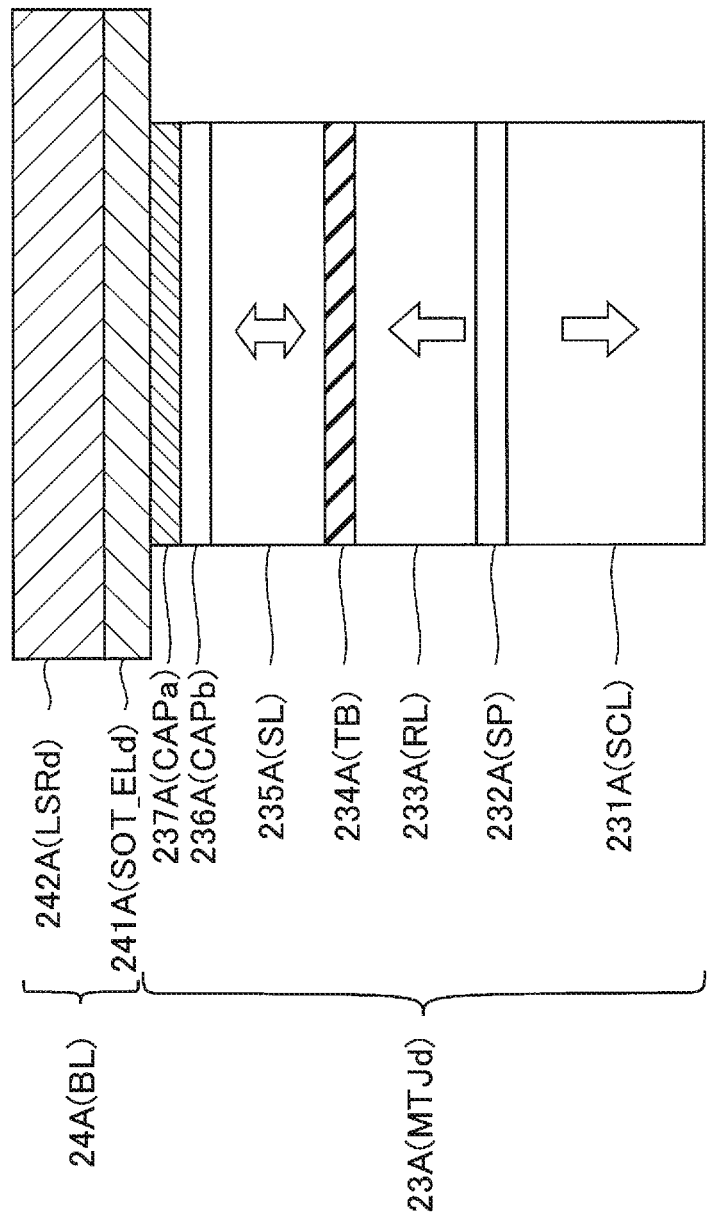
FIG. 12 is a cross-sectional view to explain a configuration of a magnetoresistive effect element of the magnetic memory device and interconnects close to a storage layer according to the second embodiment.

Next, the magnetoresistive effect element of the magnetic memory device according to the second embodiment and a configuration example of interconnects close to the storage layer is described with reference to FIG. 12. FIG. 12 is a cross-sectional view showing the magnetoresistive effect element of the magnetic memory device and the configuration of interconnects close to the storage layer according to the second embodiment and they correspond to FIG. 5 in the first embodiment. FIG. 12 shows, for example, an example of a cross section obtained by cutting the element 23A and the stacked conductor 24A shown in FIG. 10 along a plane (for example, an XZ plane) perpendicular to the Z direction. The element 26A and the stacked conductor 27A have a configuration equivalent to that of the element 23A and the stacked conductor 24A, and thus the description thereof is omitted.

As shown in FIG. 12, the element 23A includes a ferromagnet 231A functioning as a shift cancelling layer SCL, a nonmagnet 232A functioning as a spacer layer SP, a ferromagnet 233A functioning as a reference layer RL, a nonmagnet 234A functioning as a tunnel barrier layer TB, a ferromagnet 235A functioning as the storage layer SL, a nonmagnet 236A functioning as an underlayer ULb, and a nonmagnet 237A functioning as an underlayer ULa. The stacked conductor 24A includes the nonmagnet 241A functioning as spin orbit torque enhanced interconnect SOT_ELd and the nonmagnet 242A functioning as low resistance interconnect LSRd.

In the element 23A and the stacked conductor 24A, for example, from the word line WLd side toward the bit line BL side (in the Z-axis direction), a plurality of materials are stacked in order of the ferromagnet 231A, the nonmagnet 232A, the ferromagnet 233A, the nonmagnet 234A, the ferromagnet 235A, the nonmagnet 236A, the nonmagnet 237A, the nonmagnet 241A, and the nonmagnet 242A.

In the second embodiment, the ferromagnet 231A, the nonmagnet 232A, the ferromagnet 233A, the nonmagnet 234A, the ferromagnet 235A, the nonmagnet 236A, the nonmagnet 237A, the nonmagnet 241A, and the nonmagnet 242A have configurations and functions equivalent to those of the ferromagnet 227, the nonmagnet 226, the ferromagnet 225, the nonmagnet 224, the ferromagnet 223, the nonmagnet 222, the nonmagnet 221, the nonmagnet 212, and the nonmagnet 211 in the first embodiment, respectively. Thereby, in addition to the spin transfer torque, the spin orbit torque can be injected into the storage layer SL, and the magnetization direction of the storage layer SL can be controlled with respect to the magnetization direction of the reference layer RL.

2.3 Effects of Present Embodiment

According to the second embodiment, in the stacked conductor 24A, the nonmagnet 241A including a heavy metal and the nonmagnet 242A including a light metal are stacked in this order. The ferromagnet 235A in the magnetoresistive effect element MTJd close to the nonmagnet 241A within 2 nanometers. Thereby, in addition to the spin transfer torque, the spin orbit torque can be injected into the storage layer SL of the magnetoresistive effect element MTJ having the top free structure. Therefore, the same effect as that of the first embodiment can be obtained.

3. Other

The present invention is not limited to the first and second embodiments and can cover other various modifications.

For example, the first embodiment described above describes the case where both of the magnetoresistive effect elements MTJd and MTJu have the bottom free structure, and the second embodiment describes the case where both of the magnetoresistive effect elements MTJd and MTJu have the top free structure. However, the present invention is not limited to these cases. For example, one of the magnetoresistive effect elements MTJd and MTJu may have the bottom free structure, and the other may have the top free structure. When the magnetoresistive effect elements MTJd and MTJu have the bottom free structure and the top free structure, respectively, the word lines WLd and WLu become stacked conductors. On the other hand, when the magnetoresistive effect elements MTJd and MTJu have the top free structure and the bottom free structure, respectively, only the bit line BL becomes a stacked conductor. In this case, the stacked conductor applied to the bit line BL may have, for example, a stacked structure in which one layer of low resistance interconnect is sandwiched between two layers of spin orbit torque enhanced interconnect.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A magnetic memory device comprising:
   a first interconnect; and
   a magnetoresistive effect element,
   wherein the first interconnect includes:
     a first nonmagnet including copper (Cu) or aluminum (Al); and
     a second nonmagnet on the first nonmagnet, the second nonmagnet including at least one metal selected from the group consisting of 4d transition metals and 5d transition metals,
   wherein the magnetoresistive effect element includes:
     a third nonmagnet on the second nonmagnet;
     a first ferromagnet on the third nonmagnet;
     a second ferromagnet; and
     a fourth nonmagnet between the first ferromagnet and the second ferromagnet, and
   wherein the third nonmagnet has a film thickness of 2 nanometers or less.

2. The device of claim 1, wherein the third nonmagnet includes a first layer of oxide or nitride in contact with the first ferromagnet.

3. The device of claim 2, wherein the third nonmagnet includes magnesium oxide (MgO), and has a film thickness of 1 nanometer or less.

4. The device of claim 2, wherein the third nonmagnet further includes a second layer disposed between the second nonmagnet and the first layer, the second layer including at least one metal selected from the group consisting of 4d transition metals and 5d transition metals.

5. The device of claim 1, wherein the second nonmagnet includes at least one element selected from hafnium (Hf), tantalum (Ta), and tungsten (W).

6. The device of claim 1, wherein the second nonmagnet includes at least one element selected from osmium (Os), iridium (Ir), platinum (Pt), and gold (Au).

7. The device of claim 1, wherein the second nonmagnet includes at least one element selected from yttrium (Y), zirconium (Zr), niobium (Nb), and molybdenum (Mo).

8. The device of claim 1, wherein the second nonmagnet includes at least one element selected from ruthenium (Ru), rhodium (Rh), palladium (Pd), and silver (Ag).

9. The device of claim 1, wherein:
   a specific resistance of the second nonmagnet is larger than a specific resistance of the first nonmagnet, and
   a film thickness of the second nonmagnet is equal to or less than half of a film thickness of the first nonmagnet.

10. The device of claim 1, wherein the fourth nonmagnet includes magnesium oxide, and has a film thickness of 1 nanometer or less.

11. The device of claim 1, further comprising:
    a switching element coupled in series to the magnetoresistive effect element; and
    a second interconnect, the magnetoresistive effect element and the switching element being sandwiched between the first interconnect and the second interconnect.

12. The device of claim 11, wherein the magnetoresistive effect element is configured to:
    have a first resistance value according to a first current flowing from the first ferromagnet to the second ferromagnet, and
    have a second resistance value higher than the first resistance value according to a second current flowing from the second ferromagnet to the first ferromagnet.

13. The device of claim 12, further comprising a control circuit configured to:
    flow the first current and a third current flowing from a first end of the first interconnect to a second end of the first interconnect when the first ferromagnet is set to the first resistance value, and
    flow the second current and a fourth current flowing from the second end of the first interconnect to the first end of the first interconnect when the first ferromagnet is set to the second resistance value.

14. The device of claim 11, wherein the switching element is a two-terminal type switching element.

15. The device of claim 1, wherein the first ferromagnet is disposed above the first interconnect.

16. The device of claim 1, wherein the first ferromagnet is disposed below the first interconnect.

* * * * *